United States Patent [19]

Patchen

[11] Patent Number: 4,970,407
[45] Date of Patent: Nov. 13, 1990

[54] ASYNCHRONOUSLY LOADABLE D-TYPE FLIP-FLOP

[75] Inventor: Paul J. Patchen, Arlington, Tex.

[73] Assignee: National Semiconductor Corporation, Santa Clara, Calif.

[21] Appl. No.: 379,684

[22] Filed: Jul. 12, 1989

Related U.S. Application Data

[63] Continuation of Ser. No. 198,754, Jun. 9, 1988, abandoned.

[51] Int. Cl.$^5$ ............... H03K 3/289; H03K 3/26; H03K 3/29
[52] U.S. Cl. ................... 307/272.2; 307/279; 307/291; 307/452
[58] Field of Search ............... 307/272.1, 272.2, 279, 307/291; 365/185; 377/117

[56] References Cited

U.S. PATENT DOCUMENTS

| | | | |
|---|---|---|---|
| 4,394,586 | 7/1983 | Morozumi | 377/117 |
| 4,485,317 | 11/1984 | Davies, Jr. | 307/362 |
| 4,568,842 | 2/1986 | Koike | 307/272.2 |

FOREIGN PATENT DOCUMENTS

| | | | |
|---|---|---|---|
| 0070817 | 4/1985 | Japan | 307/279 |
| 0095017 | 5/1987 | Japan | 307/272.2 |
| 0018814 | 1/1988 | Japan | 307/272.2 |

OTHER PUBLICATIONS

Craig, "Hi Speed CMOS Latch Circuit", IBM Tech. Bulletin, vol. 27, No. 1B, Jun. 1984, pp. 663-664.

Primary Examiner—Timothy P. Callahan
Attorney, Agent, or Firm—Limbach, Limbach & Sutton

[57] ABSTRACT

A conventional D-type flip-flop transfers the data input D to a first output Q and a second output Q', where the second output Q' is the complement of the first output Q, on the transitions of a clock signal CK. This involves the transfer of data from a master latch and a series-connected slave latch which are loaded on alternating phases of the clock signal CK. The present invention provides for asynchronous loading of replacement data into the flip-flop by using a tri-stable buffer in both the master and slave latches. In response to a load signal LD, replacement data is injected into the master and slave latches overriding the current value stored at the Q and Q' outputs. This occurs because the load signal disables the normally active buffers while activating the loading buffers causing the normally active data path to go the tri-state condition. The state of the clock signal CK is of no importance to the outcome of the asynchronous load operation since both the master and the slave latch are overwritten during the load phase.

1 Claim, 1 Drawing Sheet

ASYNCHRONOUSLY LOADABLE D-TYPE FLIP-FLOP

This is a continuation of Ser. No. 198,754, filed on 6/9/88, now abandoned.

BACKGROUND OF THE INVENTION

1. Field of the Invention

The present invention relates to a CMOS D-type flip-flop that can be loaded asynchronously to a clock input.

2. Discussion of the Prior Art

A flip-flop is a logic circuit that includes feedback so that its output state is a function not only of the input, but also of the previous history of the input. Thus, a flip-flop may be used as a memory element.

For example, a flip-flop has two outputs, usually called Q and Q' to indicate that if the Q output is a 1, then the Q' output must be a 0. A momentary input signal will cause the outputs to "flip" so that the Q output becomes a 0 and the Q' output becomes a 1. The two output signals will remain in these states even though the input signal is removed.

An edge-triggered D-type flip-flop transfers a data input D to the Q and Q' outputs on the transitions of a clock CK. However, there are circumstances in which it is necessary to load data into the flip-flop at times other than at the clock transitions, i.e. asynchronously to the clock. For example, if the flip-flop is to be used as a timer or a counter, then an initial value must be loaded to begin the timing or the count. Also, asynchronous events may occur that require that the data value currently stored in the flip-flop be overridden.

An asynchronously loadable D-type flip-flop can be obtained by utilizing a conventional D flip-flop with asynchronous clear and preset, such as a generic HC74 device, and providing external logic to clear or preset when loading a 0 or 1, respectively. A conventional flip-flop of this type is illustrated in FIG. 1. While this approach works well, additional logic is required to steer the preset and clear lines to perform the load function.

SUMMARY OF THE INVENTION

A conventional D-type flip-flop transfers the data input D to a first output Q and a second output Q', where the second output Q' is the complement of the first output Q, on the transitions of a clock signal CK. This involves the transfer of data from a master latch and a series-connected slave latch which are loaded on alternating phases of the clock signal CK. The present invention provides for asynchronous loading of replacement data into the flip-flop by using a tri-stable buffer in both the master and slave latches. In response to a load signal, replacement data is injected into the master and slave latches, overriding the current value stored at the Q and Q' outputs. This occurs because the load signal disables the normally active buffers while activating the loading buffers, causing the normally active data path to go into the tri-state condition. The state of the clock signal CK is of no importance to the outcome of the asynchronous load operation since both the master and the slave latch are overwritten during the load phase.

The asynchronously loadable flip-flop of the present invention uses less active devices than the conventional approach. Also, the flip-flop cell is smaller than the conventional design when implemented as an integrated circuit since it uses series P-channel and N-channel devices in its master and slave portions which can share source/drain regions and, thus, utilize less die area. Another benefit is that the propagation delay between the loading of data into the flip-flop to its becoming valid on the outputs is faster than the conventional technique since fewer delay paths are in the load path.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE INVENTION

Figure 1:
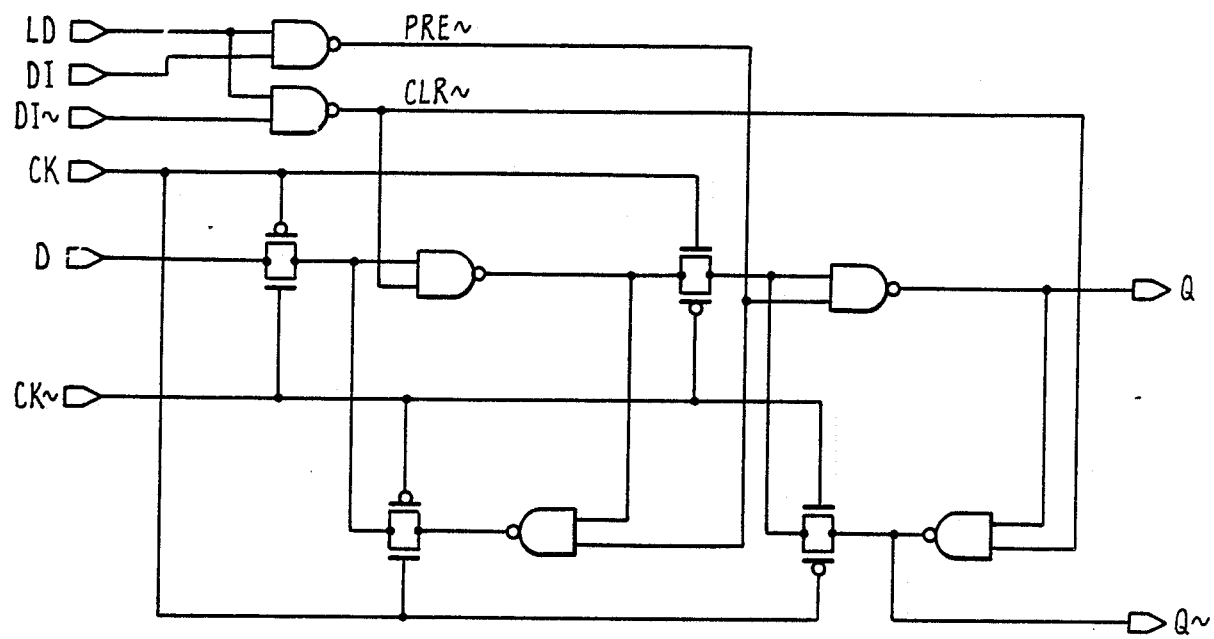
FIG. 1 is a schematic diagram illustrating a conventional asynchronously loadable D-type flip-flop.
Figure 2:
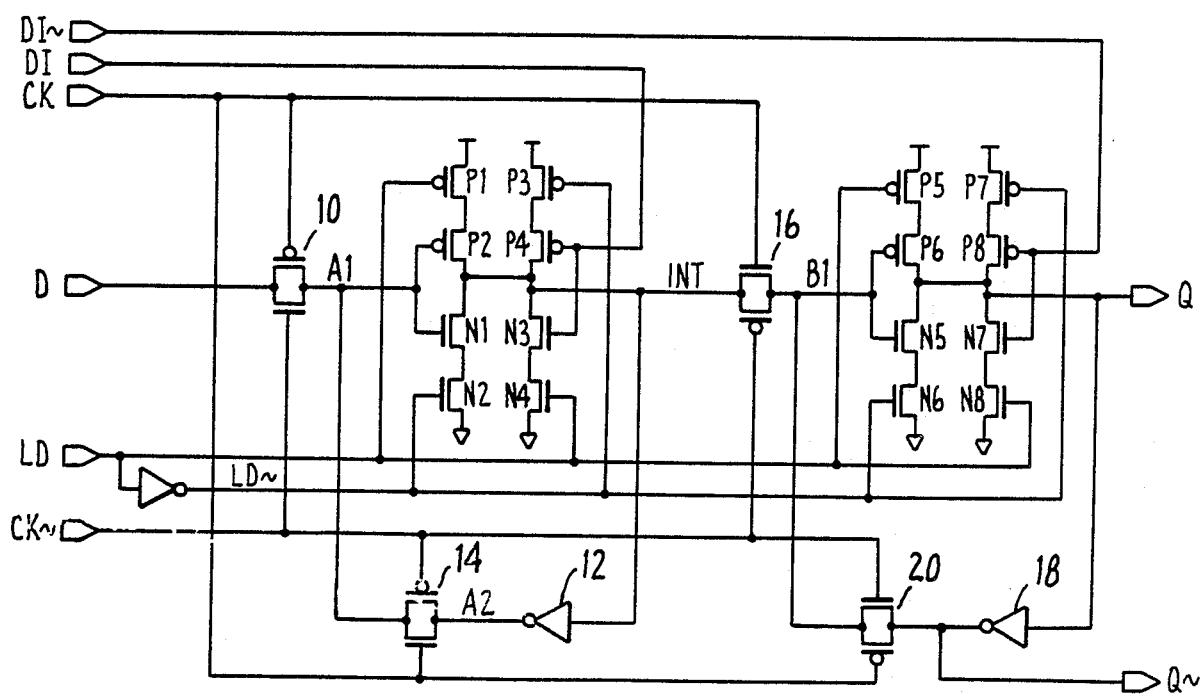
FIG. 2 is a schematic diagram illustrating an asynchronously loadable D-type flip-flop in accordance with the present invention.

FIG. 2 shows an asynchronously loadable D-type flip-flop in accordance with the present invention wherein the loading function is accomplished in the flip-flop itself, eliminating the need for additional external logic.

Referring to FIG. 2, in the normal operation of the conventional D-type flip-flop, input data D is clocked into the normal storage buffer of the master latch via node A1 during a first phase of clock cycle CK which enables transmission gate 10. At the same time, the value stored in the normal storage buffer of the slave latch is fed back to node B1 via inverter 18 and enabled transmission gate 20. During the second phase of the clock cycle CK, the value loaded in the storage buffer of the master latch is clocked into the storage buffer of the slave latch via node B1 and enabled transmission gate 16 and fed back to node A1 via inverter 12 and enabled transmission gate 14.

In accordance with the present invention, the asynchronous loading of the flip-flop is performed by using a tri-stable loading buffer in both the master latch and the slave latch of the D-type flip-flop.

The tri-stable loading buffer in the master latch consists of P-channel devices P1 and P2 and N-channel devices N1 and N2 which are connected in series between a positive power supply and ground. A similar series-connected transistor combination consisting of P-channel devices P3 and P4 and N-channel devices N3 and N4 is cross-coupled at the source/drain connections of devices P2, N1 and P4, N3, respectively. The load data signal DI is provided to the gates of devices P4 and N3. Devices P2 and N1 are controlled by the data input D via transmission gate 10, which is enabled by the clock signal CK and its complement CK'.

A similar tri-state loading buffer is provided in the slave latch and consists of series connected P-channel devices P5 and P6 and N-channel devices N5 and N6 which are cross-coupled to series connected P-channel devices P7 and P8 and N-channel devices N7 and N8.

As shown in FIG. 2, when the load signal LD is high, data is injected into the flip-flop, overriding the current value stored at the Q and Q' outputs. That is, when the load signal LD is high, the loading paths are activated since devices N4, P3, N8 and P7 all turn on. The loading buffer is activated, that is devices P1, N2, P5 and N6 turn off, causing the normally active path to assume the high impedance or tri-state. The value of load data DI is loaded into the master latch making INT=DI'. Likewise, DI' is loaded into the slave latch causing Q=DI, since there is an inversion inherent in the tri-state loading structure.

The state of the clock input CK is of no importance to the outcome of the load operation (asynchronous load) since both the master and slave latches are overwritten during the load phase.

In the non-loading operation, i.e., when the load signal LD is low, the flip-flop works as a regular rising edge triggered D flip-flop since the loading buffers are disabled. That is, devices P3, N4, P7 and N8 are off causing the load injection buffers to be in a high impedance state. Obviously, devices P1, N2, P5 and N6 are active in the non-loading state, yielding a simple inversion from nodes A1 to INT and B1 to Q, which is how a conventional D-type flip-flop is implemented.

It should be understood that the invention is not intended to be limited by the specifics of the above-described embodiment, but rather defined by the accompanying claims.

What is claimed is:

1. In a D-type flip-flop that transfers input data to first and second outputs, the second output being the complement of the first output, via a master latch and a slave latch connected in series, on transitions of a clock signal, override circuitry for loading override data into the flip-flop in response to a load signal which is asynchronous to the clock signal to replace the input data, the override circuitry comprising:

(a) a master latch comprising
  (i) a master storage buffer for storing the input data;
  (ii) a transmission gate for transferring the input data to the master storage buffer on a first phase of the clock signal;
  (iii) means for inverting the input data stored in the master storage buffer;
  (iv) feedback means for transferring the inverted input data to an input of the master storage buffer on a second phase of the clock signal;
  (v) means for replacing the input data stored in the master latch with the override data in response to the load signal; and
 (b) a slave latch comprising
  (i) a slave storage buffer for storing input data received from the master latch;
  (ii) a second transmission gate responsive to the second phase of the clock signal for transferring input data from the master latch to the slave storage buffer;
  (iii) means for inverting the input data stored in the slave storage buffer;
  (iv) feedback means for transferring the inverted input data to an input of the slave storage buffer on the first phase of the clock signal;
  (v) means for replacing the input data stored in the slave latch with override data in response to the load signal.

* * * * *